United States Patent [19]

Gershenson

[11] Patent Number: 4,589,961
[45] Date of Patent: May 20, 1986

[54] ALUMINUM MASK ANODIZATION WITH LIFT-OFF FOR PATTERNING JOSEPHSON JUNCTION DEVICES

[75] Inventor: Meir Gershenson, St. Paul, Minn.

[73] Assignee: Sperry Corporation, New York, N.Y.

[21] Appl. No.: 646,270

[22] Filed: Aug. 31, 1984

[51] Int. Cl.$^4$ .................... H01L 39/22; H01L 39/24
[52] U.S. Cl. .................... 204/15; 204/38.3; 204/42; 427/63
[58] Field of Search .................... 204/15, 38.3, 42; 427/63

[56] References Cited

U.S. PATENT DOCUMENTS

| | | | |
|---|---|---|---|
| 3,864,217 | 2/1975 | Takahata et al. | 204/15 |
| 4,003,772 | 1/1977 | Hanazono | 204/15 |
| 4,421,785 | 12/1983 | Kroger | 427/63 |
| 4,430,662 | 2/1984 | Jillie et al. | 357/5 |

*Primary Examiner*—Richard Bueker
*Attorney, Agent, or Firm*—William C. Fuess; Glenn W. Bowen

[57] ABSTRACT

In an improvement to the Selective Non-Anodizing Process (SNAP) an anodizable layer, nominally 100 nm of aluminum, is deposited on top of a 300 nm niobium—6 nm silicon—30 nm niobium tri-layer upon a substrate of oxidized silicon. The structure is then masked with photoresist and etched with an (aluminum) etchant, nominally phosphoric plus acetic plus nitric acid, which is selective to etch aluminum but not niobium. The structure, now containing a hard layer of aluminum plus an uppermost layer of photoresist over the regions where Josephson junctions will be formed, is then anodized by voltage ramping from 0 to 50 volts each 10 seconds in a saturate solution of ammonium penta borate in an equal solution of ethylene glycol and water. Both the uppermost niobium of the tri-layer and the aluminum are anodized save where protected by the photoresist. A protective insulator layer, nominally silicon mono oxide, is deposited by sputtering after which the mask of photoresist over aluminum is removed by the lift-off technique etching both anodized and remaining non-anodized aluminum. To the well-defined islands of niobium in a plane of anodized niobium, upper contact electrodes are formed by conventional deposition, photo lithographic, and etching techniques. This method so fabricating Josephson junction devices well-protects and defines the junctions under development while simultaneously reducing and simplifying the number of steps required in the patterning of the insulator layer.

36 Claims, 9 Drawing Figures

| KROGER/ JILLIE | JILLIE/ KROGER | GERSHENSON PREFERRED METHOD | GERSHENSON VARIANT #1 | GERSHENSON VARIANT #2 |
|---|---|---|---|---|
| 1. START WITH TRILAYER | 1. (SAME) | 1. (SAME) | SAME AS KROGER/JILLIE = JILLIE/KROGER WITH 2. MASK BEING SUITABLE FOR LIFT-OFF | 1. (SAME) |
|  |  | 1A. DEPOSIT ANODIZABLE LAYER |  | 1A. DEPOSIT ANODIZABLE LAYER |
| 2. MASK | 2. (SAME) | 2. (SAME) |  | 2. (SAME) |
|  |  | 2A. ETCH |  | 2A. ETCH |
| 3. ANODIZE | 3. (SAME) | 3. (SAME) |  | 3. (SAME) |
| 4. REMOVE MASK | 4A. REMOVE MASK | – (NOTHING) |  |  |
|  | 4B. DEPOSIT INSULATOR | 4B. DEPOSIT INSULATOR | 4B. DEPOSIT INSULATOR | SAME AS KROGER/JILLIE OR JILLIE/KROGER |
|  | 4C. MASK & ETCH | – (NOTHING) | – (NOTHING) |  |
|  | 4D. REMOVE MASK | 4D. REMOVE MASK (LIFT-OFF) | 4D. REMOVE MASK (LIFT-OFF) |  |
|  |  | 4E. ETCH OFF ANODIZABLE LAYER |  |  |
| 5. DEPOSIT NIOBIUM | 5. (SAME) | 5. (SAME) | SAME AS KROGER/JILLIE = JILLIE/KROGER |  |
| 6. DEPOSIT PHOTORESIST, MASK & PATTERN | 6. (SAME) | 6. (SAME) |  |  |
| 7. REMOVE MASK | 7. (SAME) | 7. (SAME) |  |  |

Fig. 3

ALUMINUM MASK ANODIZATION WITH LIFT-OFF FOR PATTERNING JOSEPHSON JUNCTION DEVICES

BACKGROUND OF THE INVENTION

1. Field of Invention

The invention is generally related to superconducting circuits and in particular to Josephson junctions made by the Selective Non-Anodizing Process (SNAP) as taught within U.S. patent application Ser. No. (179,311), now U.S. Pat. No. 4,421,785, for Josephson Tunnel Junction Device and Method of Manufacture to Harry S. Kroger. The present invention is particularly related to improved dimensional control of anodization within the SNAP by use of an anodizable mask, particularly one of aluminum. The present invention is also particularly related to a reduction in the number of steps, and simplification of steps, within the SNAP by utilization of the lift-off technique.

2. Description of the Prior Art

Superconductive circuits both for digital and analog applications which utilize Josephson tunneling are known in the art. It is important for high speed operation of digital circuits and for low noise properties of analog circuits constructed with Josephson junctions to have low capacitance in parallel to the junction.

The capacitance across the Josephson junction is composed of two parts: the capacitance between the two electrodes of the junctions and the stray capacitance of the connecting lines. The main way of reducing the junction capacitance when one is using any particular technology is to reduce the junction size.

The way to reduce the stray capacitance of the connecting lines is by adding a low dielectric insulator between the base layer and the interconnecting lines. Use of silicon monoxide (SiO) as such a dielectric insulator is reported by J. H. Grenier et al. in IBM J. Res Develop., Vol. 24 No. 2, March, 1980 [hereinafter Grenier] and use of silicon dioxide ($SiO_2$) is reported by D. J. Jillie, L. N. Smith and H. Kroger in IEEE Transactions on Magnetics, Vol. MAG-19 No. 3, May, 1983, at Page 1170 [hereinafter Jillie]. Patterning of SiO is usually done by lift-off process while Jillie teaches that patterning of $SiO_2$ is done by etching.

There are two major techniques for producing Josephson junctions. One method is by using a base layer of superconducting material taught by Grenier which has on top of it a pattern layer of insulator deposited in such a way that vias are left at the desired junction locations. Junctions are created at those locations either by oxidizing in order to create a native oxide, or by deposition of artificial barrier. A superconducting contact layer then has to be deposited and patterned on top of the junction. The main advantage of this method is freedom in the choice of the insulator. The disadvantage of this approach is the requirement for extra processing steps done at the interface layer of the junction which tend, including by risk of physical damage, to degrade its properties.

The second major method making junctions is by the SNAP (Selective Non-Anodizing Process), the common name given to the process taught in U.S. patent application Ser. No. (179,311), now U.S. Pat. No. 4,421,785, for Josephson Tunnel Junction Device and Method of Manufacture to Harry S. Kroger [hereinafter Kroger]. In the SNAP process a tri-layer of superconductor, barrier and superconductor are deposited uninterrupted. As in the first method, the barrier can be either native oxide or an artificial barrier. However, in accordance with the SNAP method, the junctions are defined by anodizing all the non-junction areas. The advantage of this SNAP method is the maintenance of clean conditions during the deposition of the junction. The disadvantage of this SNAP method is the limitation in the choice of insulator both in available thickness and the dielectric constant of the insulator. The insulator is only the oxide produced by anodization, normally niobium-penta oxide ($Nb_2O_5$), which exhibits properties of thickness and dielectric constant which contribute to a larger than desired stray capacitance. Another disadvantage of the SNAP method relevant to the present invention is resultant from difficulties with the anodizing process. During the anodization free negative oxygen ions from the liquid solution are being driven into the metal by the positive potential thereof. As a result oxide is created. The volume of the oxide is bigger than the original metal and therefore the material swells. By applying higher anodization voltage more and more oxygen penetrates the top-most oxide. The swelling of the anodized material next to the photo resist mask which defines the junctions tends to lift the mask and anodize underneath it. As a result the achievable resolution is limited by the mechanical properties of the photo resist. Furthermore, in order to achieve better ion mobility of the oxygen in the anodized layer during the anodization, it is desirable to use a hot anodizing solution. Conventional photo resists cannot withstand this hot solution. A way to overcome these photo resist limitations is by the use of deposited insulator mask. Such a process using silicon dioxide is taught by L. N. Smith, H. Kroger, and D. W. Jillie in IEEE Transaction on Magnetics Vol. MAG-19 No. 3, May, 1983 at page 787 [hereinafter Smith]. This paper is an update to the teaching of U.S. patent application Ser. No. (252,528), now U.S. Pat. No. 4,430,662, for Superconductng Tunnel Junction Integrated Circuit and Method of Manufacture Thereof to D. W. Jillie and L. N. Smith [hereinafter Jillie], which patent was filed on equal date with and which contains complementary teaching to the aforementioned Kroger patent.

The improvement to the SNAP method taught by Jillie which calls for the use of a deposited insulator mask is still subject to disadvantages, however. The deposition of the insulator tends to physically damage the top layer of superconductor over the junction due to the fact that this layer of superconductor has to be thin in order to facilitate the anodization. Any damage to this thin superconductor will degrade the junction properties. The capacitance resultant from the high dielectric constant of the anodized material can be reduced by depositing extra insulator. This insulator can be chosen according to its dielectric and mechanical properties but this insulator requires extra photolithographic processing with critical alignment over the junctions.

A common method for patterning deposted thin film is the well known lift-off method, the techniques for which are discussed in the article Lift-Off Tecniques for Fine Line Metal Patterning by J. M. Frary and P. Seese appearing in Semiconductor International for December 1981 at page 72. With the lift-off method a stencil, usually made out of photo resist, is patterned and then the required material (the insulator of Jillie) is deposited on top of it. By removing the stencil one is left with the required pattern. The lift-off method can achieve high resolution and is useful with hard to etch materials such as silicon oxide (SiO) or when one cannot find a selective etching method for different layers. In order to achieve easy removal of the stencil, it is necessary that its thickness will be higher than the deposited material. It is also desirable to have extended lips around the edge of the stencil in such a way that it will create a discontinuity in the deposited material, this discontinuity enabling the removal of the stencil and the excess material deposited on top of it.

SUMMARY OF THE INVENTION

The present invention is a modification of, and improvement to, the Selective Non-Anodizing Process (SNAP) of H. S. Kroger in U.S. patent application Ser. No. (179,311) for JOSEPH TUNNEL JUNCTION DEVICE AND METHOD OF MANUFACTURE, and to the variants of such SNAP taught by D. W. Jillie and L. N. Smith in U.S. patent application Ser. No. (252,528) for SUPPERCONDUCTING TUNNEL JUNCTION INTEGRATED CIRCUIT AND METHOD OF MANUFACTURE THEREOF. In particular, the present invention does first show that better dimensional control of anodization can be achieved by the use of an anodizable mask such as one created of the preferred material aluminum. This improved anodizable mask, preferably of aluminum, utilizable in the SNAP is a direct replacement for a prior art insulator inorganic mask which was preferably silicon dioxide ($SiO_2$). (This insulator inorganic, silicon dioxide, mask was itself a required successor in the SNAP process to the prior art utilization of insubstantially strong organic photoresist.) The anodizable metal, preferably aluminum, mask of the present invention does not damage the very thin superconductor, niobium, layer underneath it as did the prior art insulator inorganic, nominally silicone dioxide, mask. Such damage to the superconducting (nominally Nb) layer by the prior art insulator inorganic mask (nominally $SiO_2$) occurred because of a combination of physical damage induced by sputtering, and by the oxygen ($O_2$) which was contained in such prior art insulator inorganic mask ($SiO_2$). This damage results in lower quality junctions in the barrier (Si) layer sandwiched by the two supeconducting layers. The use of the present invention of an anodizable material as a mask is not subject to the chemical (oxygenation) forces that did occur upon the use of the prior art insulator inorganic mask. Thus the present invention utilizing a mask of anodizable material, preferably aluminum, does eliminate the damage, and resultant degradation, which may result from the use of a non-anodizable insulator (a conductor would not function at all) in the prior art method as an anodization mask.

The use of the (anodizable) mask of the present invention has another, totally independent and separate, beneficial aspect. This is that the use of an any mask, anodizable or not, for anodization does additionally permit of the lift-off of the next layer of insulator in the formation of a Josephson junction device, thereby saving the extra steps of photo lithography and etching of the insulator elsewise required in the production of same via the Jillie variant to the SNAP. This aspect, and use, of the (anodizable) mask of the present invention can be realized even if such (anodizable) mask is not used for the dimensional control of anodization. In other words, the same single (anodizable) mask layer, nominally aluminum, can be utilized to independently realize both a first benefit, or a second benefit, or both a first benefit and a second benefit dependent upon the sequence of steps performed. The preferred embodiment of the invention is that both the first benefit of better dimensional control of anodization and the second benefit of the lift-off of the next layer of insulator with reduced steps should be simultaneously obtained.

In such a preferred embodiment of the invention for producing improved masking of anodization via use of an anodizable, preferably aluminum, mask and additionally, subsequently to said anodization, enabling of a lift-off technique for patterning Josephson junction devices being constructed by the SNAP technique, the procedure is as follows. The present invention fabrication procedure commences with the same tri-layer sandwich of superconductor (nominally Nb), barrier layer (nominally Si), and superconductor (nominally Nb) as does the prior art SNAP fabrication procedure. In the preferred embodiment fabrication procedure of the present invention (which preferred embodiment procedure realizes both independent advantages of the present invention), there is next deposited an anodizable layer, preferably of aluminum. The next step in the present invention is the same as that performed in the prior art: photoresist is sputtered and patterned upon the supercoducting device under fabrication forming a mask thereupon. Next, however, is another newly added step: the anodizable mask layer, the aluminum, is etched. The physical appearance of the superconducting structure under fabrication at this point can be compared to the prior art. In such prior art SNAP production procedure a mask layer of photoresist would now exist directly upon the uppermost superconducting layer. By two added steps the preferred embodiment procedure of the present invention has now produced, however, the patterned layer of photoresist which is on the top of a like patterned anodizable (aluminum) mask which is then upon the uppermost superconductor layer. The next step performed in the procedure of the current invention is common to the prior art SNAP fabrication procedure: anodization is performed. At this point, and upon the completion of this step, the first advantage of the present invention of an anodizable mask according better dimensional control of anodization has already been achieved. It is entirely possible that only prior art steps of the SNAP procedure, or variants thereof, should be performed from this point forward. But such would not realize the dual, full preferred embodiment, advantages of the present invention.

To secure the second advantage of the anodizable layer of the present invention in allowing lift-off an insulator layer, revision is taken to the next steps of one particular variant of the SNAP fabrication procedure, which one variant is one of two such variants taught by D. W. Jillie, L. N. Smith and H. Kroger in IEEE Transactions on Magnetics, Vol. Mag-19 No. 3, May, 1983 at page 1170. This prior art variant does not cause next steps of removing the (photoresist) mask, depositing an insulator (nominally silicon dioxide), masking plus etching the deposited insulator, and then finally removing the mask. The preferred embodiment method of the present invention does shorten this variant process to but two steps. No step corresponding to the removal of the mask is performed. As a first step, an insulating layer, which may again be silicone dioxide, is deposited. But this insulating layer needs not be masked and etched as was required by the next prior art step. As a second step, the mask is simply removed by the lift-off technique, thereby patterning the insulator as desired. Four prior art steps have been reduced to two steps, also while continuing to allow the superior registration between the layers, resulting in the desirable lower stray capacitance of the Josephson junctions being created, which is enabled by that anodizable mask, and its associated utilization process, of the present invention.

Correspondingly, it is a first independent object of the present invention that an anodizable mask layer should be employed in the Selective Non-Anodizing Process (SNAP) to accord better dimensional control of anodization and improve protection against damage to the next lower layer below such anodizable mask, the uppermost layer of superconductor. This object is realizable independently of the realization of any further objects of the present invention.

Also correspondingly, it is a second object of the present invention that an anodizable mask layer employed in the Selective Non-Anodizing Process should allow for lift-off of the next uppermost layer of insulator, thereby saving elsewise required extra steps of photo lithography and etching of such insultor layer. This object of the present invention is obtainable independently from the first object of the present invention by utilization of the selfsame anodizable mask layer, nominally of aluminum.

It is the summary object of the present invention that both the first and second objects should be simultaneously realized, and that a single anodizable mask, preferably constructed of aluminum, should simultaneously permit of better dimensional control of anodization, and additionally of the saving of steps in patterning an insulating layer by use of the lift-off technique, in the production of superconducting circuits by the Selective Non-Anodizing Process (SNAP).

BRIEF DESCRIPTION OF THE DRAWINGS

FIG. 3 shows a table comparing the steps of three variant implementations of the present invention of aluminum anodization with lift-off for patterning Josephson junction devices with the prior art SNAP methods of Kroger/Jillie and Jillie/Kroger.

DESCRIPTION OF THE PREFERRED EMBODIMENT

Figure 1A:
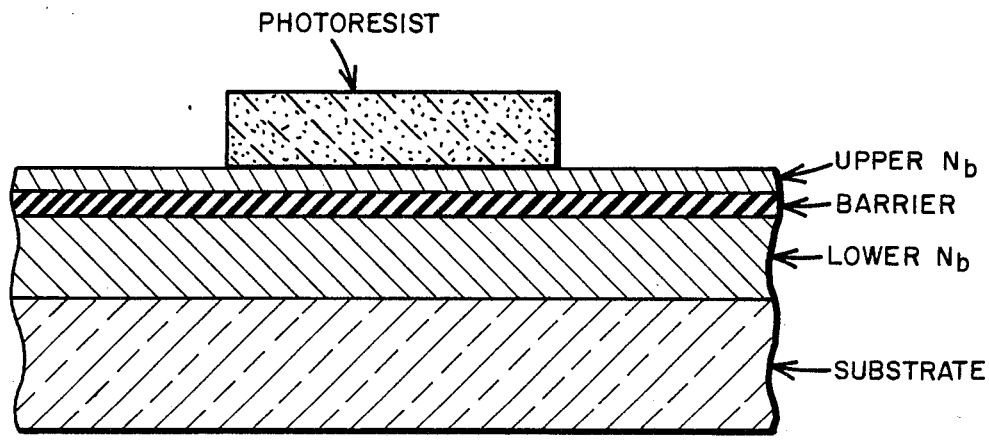
FIG. 1, consisting of FIGS. 1a, 1b, 1c, and 1d, shows a cross-section of Josephson junction device fabrication in accordance with the prior art Selective Non-Anodizing Process (SNAP).

The present invention of utilizing an anodizable lift-off mask in the production of Josephson junction devices is an improvement to, and in accordance with, the prior art Selective Non-Anodizing Procedure (SNAP) of D. W. Jillie and L. N. Smith in U.S. patent application Ser. No. 252,528 entitled SUPERCONDUCTING TUNNEL JUNCTION INTEGRATED CIRCUIT AND METHOD OF MANUFACTURE THEREOF. According to the teaching therein, the SNAP fabrication procedure begins with the deposition of a tri-layer sandwich consisting of niobium (Nb)-silicon (Si)-niobium (Nb) on top of an insulating substrate preferably of oxidized silicon ($SiO_2$). A cross-sectional view of this beginning point in the fabrication of Josephson tunnel junctions is shown in FIG. 1a as the tri-layer sandwich of UPPER Nb, BARRIER, and LOWER Nb over a base SUBSTRATE. The LOWER Nb layer is approximately 300 nm and is suggested to be deposited by magnetron sputtering. With a minimum of handling, 6 nm of silicon (Si) is deposited as the BARRIER layer in a pure argon (Ar) atmosphere in order to simplify processing. This BARRIER layer of silicone (Si) can be treated with various treatments such hydrogenation, oxidation, or doping. Other kinds of artificial barriers or a native oxide of niobium can also be used. Finally, on top of the silicon (Si) BARRIER layer another UPPER Nb layer of 30 nm of niobium is deposited, also preferably by magnetron sputtering. The combination layers of niobium, silicon, and niobium are spoken of as a "tri-layer". It should be appreciated that each of such layer, including the uppermost niobium layer, is very thin and susceptible to damage by physical forces.

Continuing in the prior art fabrication procedure of Josephson junction devices in accordance with he prior art Selective Non-Anodizing Procedure (SNAP) as shown in FIG. 1, upon the top of the tri-layer either a PHOTORESIST (as illustrated in FIG. 1a) or a patterned silicon dioxide ($SiO_2$) layer is taught to be used as the anodization mask. The insulator inorganic mask of silicone dioxide has been sometimes preferred for being physically stronger than the organic photoresist, and for allowing improved dimensional control resulting in reported device dimensions which are the same as the mask dimensions within at least 100 nm. The silicon dioxide (quartz) mask was applied by sputtering, which, in combination with the free oxygen from such silicon dioxide, tended to damage the top niobium layer. The present invention of an aluminum mask will later be seen to circumvent the difficulties with both the organic photoresist, or the insulator inorganic mask of silicon dioxide.

Continuing with the fabrication procedure for Josephson tunnel junction devices in accordance with the prior art Selective Non-Anodizing Procedure (SNAP) as shown in FIG. 1, the anodization of the UPPER Nb layer in accordance with the patterned PHOTORESIST is next performed. The anodization is nominally performed by dipping the device under fabrication in a saturate solution of ammonium penta borate in water mixed with an equal amount of ethylene glycol. A ramping from 0 volts to approximately 50 volts at a constant rate in approximately 10 seconds (approximately 5 volts/second ramp rate) is applied to the sample. The anodization process itself provides a means of detecting when the entire unprotected uppermost niobium layer is completely anodized. When a constant current source is used for anodizing, and the cell voltage as a function of time is recorded, there is a change in current when the anodization profile reaches the silicon BARRIER. The top layer of UPPER Nb has been converted to niobium penta oxide ($Nb_2O_5$) at all areas not protected by the PHOTORESIST mask. This result is illustrated in FIG. 1b as ANODIZED Nb. It should be visualized that the active devices (a Josephson tunnel junction being in process of fabrication in the area of NONANODIZED UPPER Nb ELECTRODE) are isolated islands on the wafer which is largely covered by niobium penta oxide ($Nb_2O_5$). After the mask, either of PHOTORESIST or of silicon dioxide, is removed, the device under fabrication assumes the cross-sectional aspects shown in FIG. 1b. The SNAP is therefoe remeniscent of the conventional planer process or of oxide isolation in silicon integrated circuit technology. The advantage of the SNAP method, wherein the junctions are defined by anodizing all the non-junction areas, is the maintenance of clean conditions during the generation of the junction. The disadvantage of the SNAP method is the limitation in the choice of insulator both in available thickness and in the dielectric constant of such insulator: the insulator being only the oxide produced by the anodization, nominally the niobium penta oxide ($Nb_2O_5$). The properties of this niobium penta oxide insulator in thickness and dielectric constant contribute to a larger than desired stray capacitance. This disadvantage is dealt with in the present invention by the addition of extra insulator, nominally silicon monoxide (SiO) or silicon dioxide ($SiO_2$).

Another disadvantage of the SNAP, which disadvantage is also dealt with by the present invention, is resultant from difficulties with the anodizing process. During the anodization free negative ions from the liquid solution are being driven into the metal by the positive potential thereof. As a result the desired oxide is created. The volume of such oxide, nominally niobium penta oxide, is bigger than the original (Nb) metal, and therefore the material swells. This swelling is illustrated in the transition from FIG. 1a to FIG. 1b. The swelling of the anodized material next to the PHOTORESIST mask which defines the junctions tends to lift such PHOTORESIST mask and anodize underneath it. As a result the achievable resolution of the junctions is limited to the mechanical properties of the PHOTORESIST. Furthermore, in order to acheive better ion mobility of the oxygen in the anodized layer during the anodization, it is desirable to use a hot anodizing solution. Conventional organic photoresist cannot withstand this hot solution. Therefore the preferred prior art utilization of silicon dioxide as the deposited insulator mask is taught by L. N. Smith, H. Kroger and D. W. Jillie in IEEE Transactions on Magnetics, Vol. Mag-19, No. 3, May, 1983 at page 787. This paper is an update to the aforementioned U.S. patent application Ser. No. (252,528). The deposition of the patterned silicon dioxide mask does, however, tend to physically damage the top layer of superconductor which needs be approximately 30 nm thin in order to facilitate the anodization. Any damage to this UPPER Nb will degrade the junction properties.

Figure 1B:
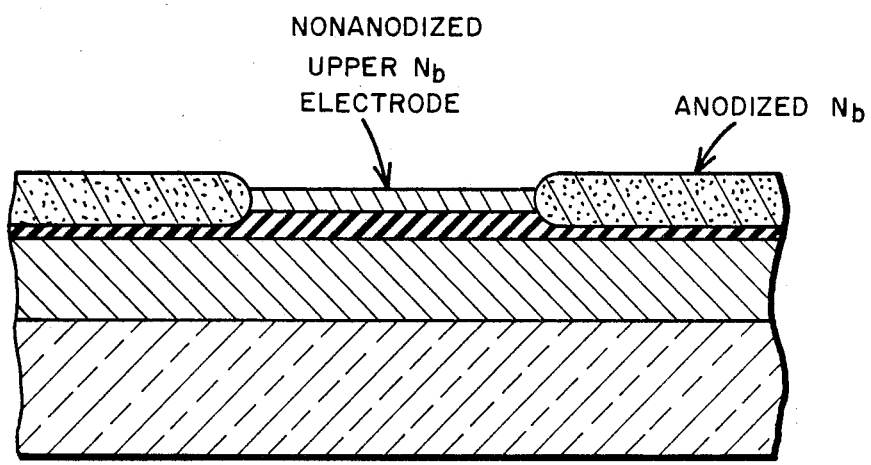
Figure 1C:
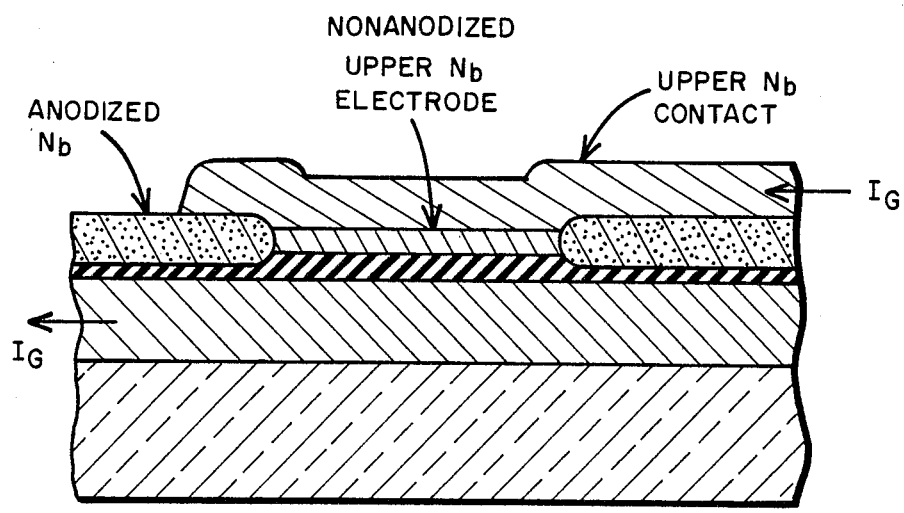
Figure 1D:
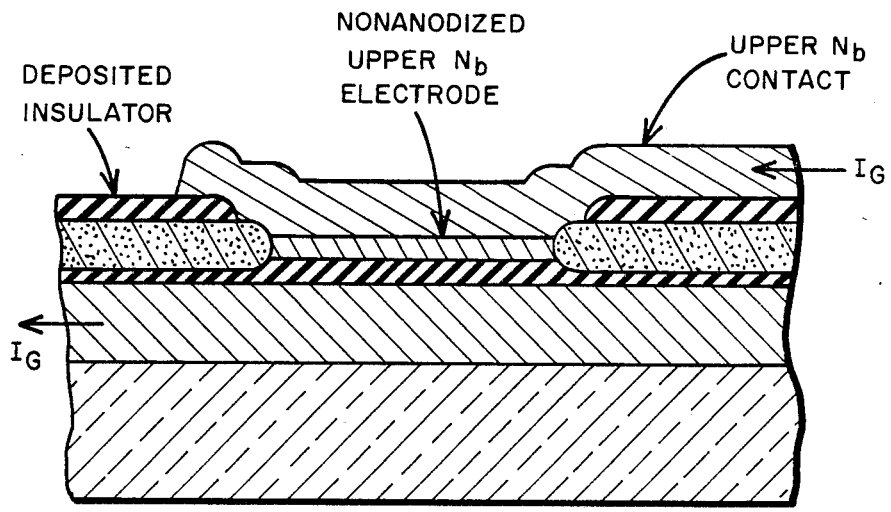

Continuing with the prior art fabrication of a Josephson tunnel junction device in accordance with the prior art Selective Non-Anodizing Process (SNAP) as shown in FIG. 1, the partially completed device shown in cross-sectional view in FIG. 1b can be completed in accordance with processing leading either to FIG. 1c or FIG. 1d. After the removal of the mask as shown in FIG. 1b, the device can be completed simply by adding a niobuim layer, depositing photoresist, masking and patterning the niobium layer in accordance with such photoresist, and removing the mask: thereby forming a patterned contact niobium layer. Such procedure resulting in the UPPER Nb CONTACT shown in FIG. 1c leaves the ANODIZED Nb as the only insulator. This most basic method of the formation of a complete Josephson tunnel junction device in accordance with the Selective Non-Anodizing Process is called the Kroger/Jillie method and is shown in the steps thereof in the first column of FIG. 3.

A preferred alternative method to the completion of the partially formed Josephson device shown in FIG. 1b is also taught in the aforementioned prior art article and patent application. To the device FIG. 1b (wherein the mask has been removed) a new layer of silicon dioxide is deposited, masked and etched to form a pattern, and then removed: thereby forming a layer of DEPOSITED INSULATOR as shown in FIG. 1d. From this point, the remaining steps of the deposit of a niobium layer, and the patterning of such a mask subsequently removed, is identical to the aforementioned Kroger/Jillie process variation. The preferred variation wherein a DEPOSITED INSULATOR layer should be created in order to protect the underlying layer of ANODIZED Nb is called the Jillie/Kroger variant of the SNAP, the steps of which are enumerated in the second column of the table of FIG. 3.

Figure 2A:
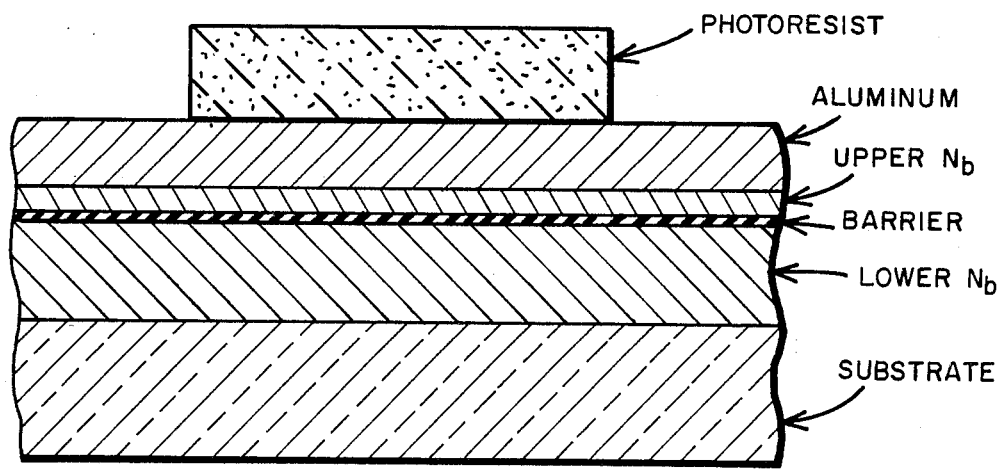
FIG. 2, consisting of FIGS. 2a, 2b, 2c and 2d, shows a cross-section of Josephson junction device fabrication in accordance with the improved SNAP of the present invention utilizing an anodizable, preferably aluminum, mask for anodization and the subsequent lift-off of such mask for patterning Josephson junction devices.
Figure 2B:
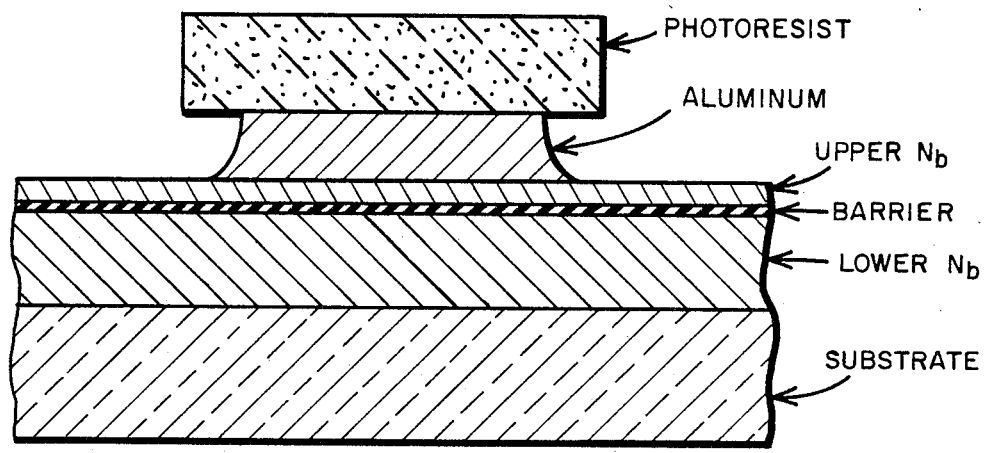
Figure 2C:
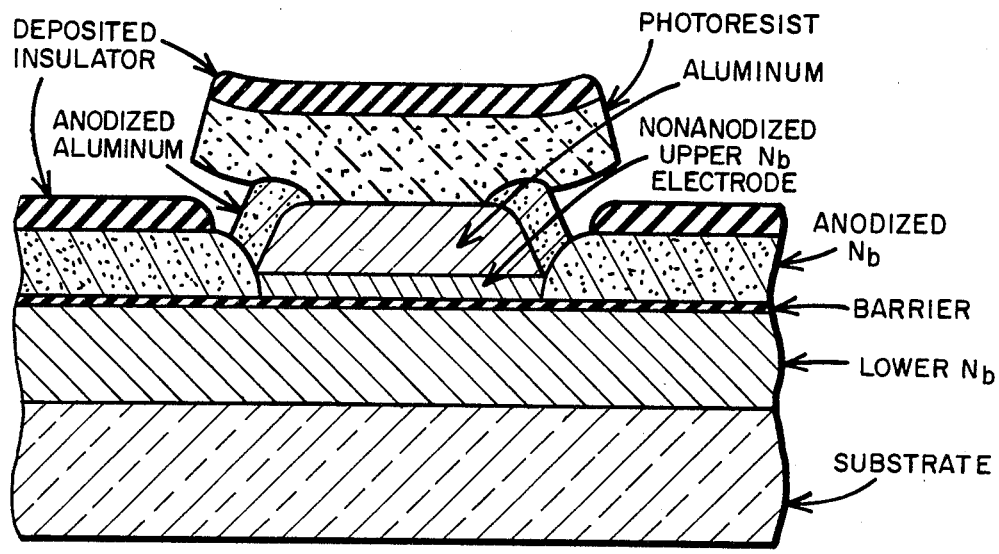
Figure 2D:
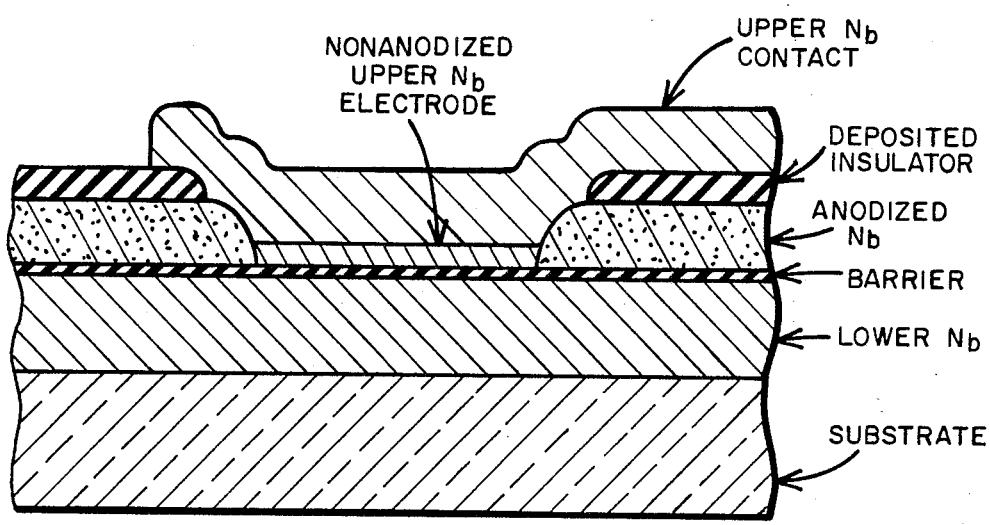

The method of the present invention, an improvement to the prior art Selective Non-Anodizing Process, using aluminum mask anodization with lift-off for patterning Josephson junction devices is shown in FIG. 2, consisting of FIG. 2a through FIG. 2d. Starting with the same tri layer of LOWER Nb, BARRIER, and UPPER Nb deposited upon a SUBSTRATE as is utilized in the SNAP, the present invention calls that approximately 100 nm of an anodizable material, nominally ALUMINUM, is next deposited by vacuum deposition, preferably at the same deposition station from which the tri-layer is produced without breaking the vacuum. On top of the ALUMINUM layer the PHOTORESIST is spun and patterned into a mask. It is possible to treat the ALUMINUM layer with an adhesion promoter such as Hexamethyldisilazane (H.M.D.S.), made by KTI, or by plasma cleaning, prior to the spinning of the PHOTORESIST (although such is not absolutely necessary). The device under fabrication is next etched chemically by an etchant which is selective to etch aluminum but not niobium. This etchant is preferably unfluoridated, and is preferably 25 parts phosphoric acid to four parts acetic acid to one part nitric acid by volume. This unfluoridated etchant etches the aluminum, but not the niobium, in such a way that the photorsist will create an overhang which will later be helpful in the removal of the mask by a lift-off technique. The result of the etching is shown in FIG. 2b.

Already at this point of the improved process of the present invention attaining the structure as shown in FIG. 2b, the entirety of the remaining process may be accomplished in accordance with either the prior art method of Kroger/Jillie or Jillie/Kroger as are respectively shown in the first and second columns of the table of FIG. 3. Such would be the sequence of steps shown as Gershenson Variant No. 2 in the 5th column of the table of FIG. 3. Of course, the "remove mask" shown as step 4 would entail the removal of both the PHOTORESIST and the ALUMINUM shown in FIG. 2b. Already, and even if only the conventional and prior art steps of the SNAP are (in any of the prior art variants) performed, an advantage has been attained in realizing the structure of FIG. 2b. Mainly, the UPPER Nb layer, which is 30 nm thin in the area of the junction, is now protected by the hard ALUMINUM. In the subsequent anodizing step, such ALUMINUM will permit of a hot anodizing solution, and will exhibit superior characteristics to being lifted at the edges by the swelling of the UPPER Nb as it is anodized into ANODIZED Nb. This is because that, in addition to the anodization of the niobium, some of the exposed ALUMINUM, especially at the edges of the junction under the PHOTORESIST mask, is simultaneously being anodized (aluminum being an anodizable material). This anodizing of the mask material allows superior dimensional definition of the junction, also superiorly protecting the UPPER Nb layer underneath from physical damage resulting in electrical shorts.

The preferred embodiment method of the present invention, however, continues to progress with a series of steps which allow yet another advantage to be attained. Mainly, after the anodization (conventionally in accordance with such step as taught for the SNAP) resulting in the ANODIZED ALUMINUM and ANODIZED Nb shown in FIG. 2c, the device under development is cleaned and dried and an insulator such as silicon mono oxide (SiO) is deposited. This results in the cross-sectional view including the DEPOSITED INSULATOR layer shown in FIG. 2c. At this point the PHOTORESIST is removed by the use of a standard photoresist remover such as product J-100 available from Shipley Inc., Newton, Mass. By this operation the DEPOSITED INSULATOR in the area over the PHOTORESIST is being removed by the lift-off technique. Next, both the ALUMINUM and the ANODIZED ALUMINUM are removed with an aluminum etch such as the one used for the previous patterning (the 25 parts phosphoric acid to four parts acetic acid to one part nitric acid by volume). At this stage care should be taken to remove all of the ANOZIDED ALUMINUM which etches much more slowly that the plain ALUMINUM. This sequence of operations is shown as steps 4 in the third column Gershenson Preferred Method shown in FIG. 3. It may be noted that certain of such steps have correspondence to the depositing and patterning of an insulator which is obtained in the Jillie/Kroger Method, the method which led to the device previously shown in FIG. 1d. But the steps of the present invention will be observed to be reduced in number, and easier to perform. Therefore a second advantage of the present invention is obtained in that DEPOSITED INSULATOR layer may be obtained, and masked, with superior ease.

The remaining steps of the present method are the same as the prior art Kroger/Jillie and Jillie/Kroger methods shown in the respective first and second columns of the table of FIG. 3. Mainly, the production of the junction is finished by the deposition of contact to the top electrodes and the patterning of such contacts with conventional photo lithographic and etching techniques, realizing the final structure shown in FIG. 2d which is equivalent to the structure shown in FIG. 1d. It should be recognized that, as a somewhat awkward variance, the alternative sequence of steps shown as Gershenson Variant No. 1 in the 4th column of the table of FIG. 4 could be performed in protecting the NONANODIZED UPPER Nb ELECTRODE shown in FIG. 2b from damage occurring upon the depositing of the insulator layer (either silicon mono oxide (SiO) or silicon dioxide as taught by JILLIE/KROGER). Mainly, the ALUMINUM could be deposited, and patterned, after the anodization of the UPPER Nb producing the ANODIZED Nb. But to employ the aluminum mask of the present invention only in those steps regarding the creation of the DEPOSITED INSULATOR, so that such may be utilized to support the lift-off technique, would obviate of obtaining those benefits which were previously described to accrue upon the anodizing of the UPPER Nb, producing thereby ANODIZED Nb, in patterning the Josephson junction device. Therefore, the preferred, composite, method of the present invention which does teach of an anodizable mask supporting anodization patterning, with subsequent advantges to lift-off in the creation of insulating layers, in the fabrication of Josephson junction devices is enumerated as the Gershenson Preferred Method in the 3rd column of the table of FIG. 3. By correspondence of such Gershenson Preferred Method with the prior art steps of Kroger/Jillie and Jillie/Kroger the correspondence, and differences, from the prior art SNAP method and variants thereto may readily be seen.

While a specific preferred embodiment of the invention has been described to utilize an aluminum mask, and certain preferred etching and deposition processes, it will be understood that the basic principles of the invention may be utilized in an alternative manner. Furthermore, although the invention has been particularly shown and described with reference to the preferred embodiments thereof, it will be understood by those skilled in the art that various alterations in form and detail may be made therein without departing from the spirit and scope of the invention. For example, tantalum could be used instead of aluminum, or silicon nitride could be used instead of silicon dioxide as an insulator.

The embodiments of the invention in which an exclusive property or privilege is claimed are defined as follows:

1. An improvement to the Selective Non-Anodizing Process (SNAP) for patterning Josephson Junction Devices according both (1) masking of anodizing with a mask material harder and more durable that photoresist, and also (2) usage of the lift-off technique, said improvement method comprising:
   starting with a workpiece tri-layer of top-layer superconductor on top of a barrier insulator layer on top of a superconductor layer upon a substrate; then
   first depositing a layer of anodizable material which anodizable material is harder and more durable than photoresist; then
   masking said layer of anodizable material with photoresist patterned to remain only in the regions where Josephson tunneling barriers will be formed; then
   first etching said workpiece tri-layer with deposited and masked layer of anodizable material with an etchant which is selective to etch said anodizable material but not said top-layer superconductor, said masking plus said first etching leaving a mask combinatorially of said photoresist on top of said anodizable material only in the regions where Josephson tunneling barriers will be formed; then
   anodizing said workpiece tri-layer with mask combinatorially of photoresist on top of anodizable material until said top-layer superconductor and also said layer of said anodizable material in the area not protected by said photoresist are both anodized; then
   second depositing a layer of insulator material; then
   removing said mask combinatorially of said photoresist on top of said anodizable material in accordance with the lift-off technique by second etching both anodized and remaining non-anodized of said anodizable material;

wherein what is produced by said starting, said depositing, said masking, said first etching, said anodizing, and said removing is well-defined islands of superconductor in a plane of anodized superconductor, each said island suitable to be an upper Josephson Junction electrode if upper contact electrodes are further conventionally formed by depositing of niobium, depositing of photoresist, masking, patterning by etching niobium, and removing the mask;

whereby firstly accorded by said starting, said depositing, said masking, said first etching, and said anodizing is that said anodizing has been masked in said regions where Josephson tunneling barriers will be formed not only by said photoresist, but also by said layer of anodizable material which is harder and more durable than photoresist, which anodizable material is a layer deposited immediately above said top-layer superconductor;

whereby secondly accorded by said starting, said depositing, said masking, said first etching, said anodizing, said second depositing and said removing is that entire said layers which are above said mask of anodizable material, including said layer of insulator material, are removed in the area above said mask by the lift-off technique when said anodizable material, both anodized and non-anodized, is removed.

2. The improvement method of claim 1 wherein said starting further comprises:
    starting with a workpiece tri-layer of top-layer niobium on top of a barrier layer of silicon on top of a niobium layer upon a substrate of anodized silicon.

3. The improvement method of claim 1 wherein said first depositing further comprises:
    first depositing a layer of the anodizable material aluminium which aluminum is harder and more durable than photoresist.

4. The improvement method of claim 3 wherein said first etching further comprises:
    first etching said workpiece tri-layer with deposited and masked aluminum with an etchant solution of phosphoric acid plus acetic acid plus nitric acid which is selective to etch aluminum but not niobium.

5. The improvement method of claim 1 wherein said first depositing further comprises:
    first depositing a layer of the anodizable material tantalum which tantalum is harder and more durable than photoresist.

6. The improvement method of claim 1 which between said first depositing and said masking further comprises:
    treating said layer of anodizable material with a substance promoting the adhesion of photoresist.

7. The improvement method of claim 3 which between said first depositing and said masking further comprises:
    treating said layer of aluminum with Hexamethyldisilazane in order to promote the adhesion of photoresist.

8. The improvement method of claim 3 which between said first depositing and said masking further comprises:
    treating said layer of aluminum by plasma cleaning in order to promote the adhesion of photoresist.

9. The improvement method of claim 1 wherein said anodizing step further comprises:
    anodizing said workpiece tri-layer with mask combinatorially of photoresist on top of anodizable material by a constant current source repetitively ramping from approximately 0 volts to approximtely 50 volts in approximately 10 seconds in a saturate solution of ammonium penta borate in an equal solution of water and ethylene glycol until the current measured of said constant current source changes in indication that entire said unmasked top-layer superconductor of said tri-layer has been anodized, and said barrier insulator layer has been reached by ongoing anodization.

10. The improvement method of claim 9 wherein said anodizing step further comprises
    anodizing with a hot saturate solution of ammonium penta borate in an equal solution of water and ethylene glycol.

11. The improvement method of claim 1 wherein said second depositing further comprises:
    second depositing a layer of silicon mono oxide (SiO).

12. The improvement method of claim 1 wherein said second depositing further comprises:
    second depositing a layer of silicon dioxide (SiO$_2$).

13. The improvement method of claim 1 whrein said second depositing further comprises:
    second depositing a layer of silicon nitride.

14. An improvement to the Selective Non-Anodizing Process (SNAP) for patterning Josephson Junction devices according that the masking of anodizing shall be with a mask material harder and more durable than photoresist, said improvement method comprising:
    starting with a workpiece tri-layer of top-layer superconductor on top of a barrier insulator layer on top of a superconductor layer upon a substrate; then
    depositing a layer of anodizable material which anodizable material is harder and more durable than photoresist; then
    masking said layer of anodizable material with photoresist patterned to remain only in the regions where Josephson tunneling barriers will be formed; then
    first etching said workpiece tri-layer with deposited and masked layer of anodizable material with an etchant which is selective to etch said anodizable material but not said top-layer superconductor, said masking plus said etching leaving a mask combinatorially of said photoresist on top of said anodizable material only in the regions where Josephson tunneling barriers will be formed; then
    anodizing said workpiece tri-layer with mask combinatorially of photoresist on top of anodizable material until said top-layer superconductor and also said layer of said anodizable material in the area not protected by said photoresist are both anodized; then
    removing said mask combinatorially of said photoresist on top of said anodizable material by second etching both anodized and remaining non-anodized of said anodizable material;
    wherein what is produced by said starting, said depositing, said masking, said first etching, said anodizing, and said removing is well-defined islands of superconductor in a plane of anodized superconductor, each said island suitable to be an ûpper Josephson Junction electrode if upper contact electrodes are further conventionally formed by depositing of niobium, depositing of photoresist, masking, patterning by etching niobium, and removing the mask;

whereby said starting, said depositing, said masking, said first etching, and said anodizing has accorded that said anodizing has been masked in said regions where Josephson tunneling barriers will be formed not only by said photoresist, but also by a mask of anodizable material which is harder and more durable than photoresist.

15. The improvement method of claim 14 wherein said starting further comprises:
starting with a workpiece tri-layer of top-layer niobium on top of a barrier layer of silicon on top of a niobium layer upon a substrate of anodized silicon.

16. The improvement method of claim 14 wherein said first depositing further comprises:
first depositing a layer of anodizable material aluminum which aluminum is harder and more durable than photoresist.

17. The improvement method of claim 16 wherein said first etching further comprises:
first etching said workpiece tri-layer with deposited and masked aluminum with an etchant solution of phosphoric acid plus acetic acid plus nitric acid which is selective to etch aluminum but not niobium.

18. The improvement method of claim 14 wherein said first depositing further comprises:
first depositing a layer of the anodizable material tantalum which tantalum is harder and more durable than photoresist.

19. The improvement method of claim 14 which between said first depositing and said masking further comprises:
treating said layer of anodizable material with a substance promoting the adhesion of photoresist.

20. The improvement method of claim 16 which between said first depositing and said masking further comprises:
treating said layer of aluminum with Hexamethyldisilazane in order to promote the adhesion of photoresist.

21. The improvement method of claim 16 which between said first depositing and said masking further comprises:
treating said layer of aluminum by plasma cleaning in order to promote the adhesion of photoresist.

22. The improvement method of claim 16 wherein said anodizing step further comprises:
anodizing said workpiece tri-layer with mask combinatorially of photoresist on top of anodizable material by constant current source repetitively ramping from approximately 0 volts to approximately 50 volts in approximately 10 seconds in a saturate solution of ammonium penta borate in an equal solution of water and ethylene glycol until the current measured of said constant current source changes in indication that entire said unmasked top-layer superconductor of said tri-layer has been anodized, and said barrier insulator layer has been reached by ongoing anodization.

23. The improvement method of claim 22 wherein said anodizing step further comprises
anodizing with a hot saturate solution of ammonium penta borate in an equal solution of water and ethylene glycol.

24. An improvement to the Selective Non-Anodizing Process (SNAP) for patterning Josephson Junction Devices according usage of the lift-off technique, said improvement method comprising:

starting with a workpiece tri-layer of top-layer superconductor on top of a barrier insulator layer on top of a superconductor layer upon a substrate; then
first depositing a layer of material suitable for being lifted-off by etching; then
masking said layer of material with photoresist patterned to remain only in the regions where Josephson tunneling barriers will be formed; then
etching said layer of material with an etchant which is selective to etch said material but not said top-layer superconductor, said masking plus said etching leaving a mask combinatorially of said photoresist on top of said material only in the regions where Josephson tunneling barriers will be formed; then
anodizing said workpiece tri-layer with mask combinatorially of photoresist on top of said material top-layer superconductor in the area not protected by said photoresist is etched; then
second depositing a layer of insulator material; then
removing said mask combinatorially of said photoresist on top of said material by the lift-off technique;
wherein what is produced by said starting, said first depositing, said masking, said etching, said anodizing, said second depositing and said removing is islands of superconductor in a plane of anodized superconductor, each said island suitable to be an upper Josephson Junction electrode if upper contact electrodes are further conventionally formed by depositing of niobium, depositing of photoresist, masking, patterning by etching niobium, and removing the mask;
wherein by said removing in accordance with said lift-off technique said layer of insulator material has been removed from over said islands of superconductor which are each suitable to be an upper Josephson Junction electrode.

25. The improvement method of claim 24 wherein said starting further comprises:
starting with a workpiece tri-layer of top-layer niobium on top of a barrier layer of silicon on top of a niobium layer upon a substrate of anodized silicon.

26. The improvement method of claim 24 wherein said first depositing further comprises:
first depositing a layer of the anodizable material aluminum which aluminum is harder and more durable than photoresist.

27. The improvement method of claim 26 wherein said etching further comprises:
etching said workpiece tri-layer with deposited and masked aluminum with an etchant solution of phosphoric acid plus acetic acid plus nitric acid which is selective to etch aluminum but not niobium.

28. The improvement method of claim 24 wherein said first depositing further comprises:
first depositing a layer of the anodizable material tantalum which tantalum is harder and more durable than photoresist.

29. The improvement method of claim 24 which between said first depositing and said masking further comprises:
treating said layer of anodizable material with a substance promoting the adhesion of photoresist.

30. The improvement method of claim 26 which between said first depositing and said masking further comprises:

treating said layer of aluminum with Hexamethyldisilazane in order to promote the adhesion of photoresist.

31. The improvement method of claim 26 which between said first depositing and said masking further comprises:

treating said layer of aluminum by plasma cleaning in order to promote the adhesion of photoresist.

32. The improvement method of claim 24 wherein said anodizing step further comprises:

anodizing said workpiece tri-layer with mask combinatorially of photoresist on top of anodizable material by a constant current source repetitively ramping from approximately 0 volts to approximately 50 volts in approximately 10 seconds in a saturate solution of ammonium penta borate in an equal solution of water and ethylene glycol until the current measured of said constant current source changes in indication that entire said unmasked top-layer superconductor of said tri-layer has been anodized, and said barrier insulator layer has been reached by ongoing anodization.

33. The improvement method of claim 32 wherein said anodizing step further comprises anodizing with a hot saturate solution of ammonium penta borate in an equal solution of water and ethylene glycol.

34. The improvement method of claim 24 wherein said second depositing further comprises:

second depositing a layer of silicon mono oxide (SiO).

35. The improvement method of claim 24 wherein said second depositing further comprises:

second depositing a layer of silicon dioxide ($SiO_2$).

36. The improvement method of claim 24 wherein said second depositing further comprises:

second depositing a layer of silicon nitride.

* * * * *